United States Patent
Suzuki et al.

(10) Patent No.: US 7,812,877 B2
(45) Date of Patent: Oct. 12, 2010

(54) I/F CONVERSION DEVICE AND PHOTO-DETECTION DEVICE

(75) Inventors: Takashi Suzuki, Hamamatsu (JP); Itsushi Tadamasa, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 993 days.

(21) Appl. No.: 10/554,697

(22) PCT Filed: Apr. 28, 2004

(86) PCT No.: PCT/JP2004/006206
§ 371 (c)(1), (2), (4) Date: Aug. 8, 2006

(87) PCT Pub. No.: WO2004/097434
PCT Pub. Date: Nov. 11, 2004

(65) Prior Publication Data
US 2006/0273830 A1 Dec. 7, 2006

(30) Foreign Application Priority Data
Apr. 28, 2003 (JP) ............................. 2003-124276

(51) Int. Cl.
*H04N 3/14* (2006.01)
*H04N 5/335* (2006.01)

(52) U.S. Cl. .................. 348/302; 348/294; 348/312; 348/307; 348/308

(58) Field of Classification Search .................. 348/294, 348/297, 307, 312; 250/208.1; 257/290–292
See application file for complete search history.

(56) References Cited

U.S. PATENT DOCUMENTS

| 5,614,871 A | 3/1997 | Miyabe |
| 6,586,743 B1 * | 7/2003 | Overdick et al. ........ 250/370.11 |

FOREIGN PATENT DOCUMENTS

| JP | 49-24459 A | 3/1974 |
| JP | 56-154673 A | 11/1981 |
| JP | 64-15973 | 1/1989 |
| JP | 2-64421 | 3/1990 |
| JP | 2002-107428 | 4/2002 |

* cited by examiner

*Primary Examiner*—Yogesh K Aggarwal
(74) *Attorney, Agent, or Firm*—Drinker Biddle & Reath LLP

(57) ABSTRACT

An I/F converter 10 includes a first comparator portion $11_1$, a second comparator portion $11_2$, a current mirror circuit 14, a reference voltage source 15, an SR-type flip-flop circuit 16, a buffer amplifier 18, a first capacitive element $C_1$, a second capacitive element $C_2$, a switch $SW_1$, a switch $SW_2$, a switch $SW_{11}$, and a switch $SW_{21}$. The respective operational characteristics of the first comparator portion $11_1$ and the second comparator portion $11_2$ are identical to each other. The respective capacitance values of the two capacitive elements $C_1$ and $C_2$ are equal to each other. The I/F converter 10 is connected at its input end 10a to a photodiode PD, such that a current generated in the photodiode PD is inputted to the input end 10a, allowing a signal at a frequency corresponding to the amplitude of the inputted current to be outputted from the buffer amplifier 18 to the counter portion 19. Accordingly, provided is an I/F converter and a photodetector which can realize a high input/output related linearity with high accuracy over a wide dynamic range.

10 Claims, 12 Drawing Sheets

I/F CONVERSION DEVICE AND PHOTO-DETECTION DEVICE

TECHNICAL FIELD

The present invention relates to a current-to-frequency (I/F) converter which outputs a signal at a frequency corresponding to the amplitude of a current inputted to the input end, and also relates to a photodetector which includes such an I/F converter and a photosensitive element.

BACKGROUND ART

Photosensitive elements (e.g., photodiodes or photomultipliers) can output a current corresponding in amplitude to the intensity of incident light, thereby detecting the light intensity based on the current value. Such a photosensitive element has a good linearity between the intensity of incident light and the output current value over a wide dynamic range of the intensity of incident light. On the other hand, it is known that the dynamic range of the sensitivity of the human eye to the intensity of light is about six orders of magnitude.

In this context, an A/D converter for inputting the value of a current outputted from the photosensitive element for analog to digital conversion is required to output a digital value of a number of bits corresponding to the intensity of light over such a wide dynamic range. For example, corresponding to the dynamic range of light intensity being six orders of magnitude, the A/D converter is required to output a digital value of 20 bits. However, it is difficult to realize such an A/D converter that outputs a digital value of 20 bits.

To address such a problem, there has been suggested an I/F converter which outputs a signal at a frequency corresponding to the amplitude of inputted current (e.g., see Japanese Patent Application Laid-Open No. 2002-107428). This I/F converter inputs the value of a current outputted from the photosensitive element to output a pulsed signal at a frequency corresponding to the magnitude of the value of the current (i.e., the intensity of light made incident upon the photosensitive element). Accordingly, by counting the number of pulses per unit time in the signal outputted from the I/F converter, it is possible to obtain the light intensity as a digital value over a wide dynamic range.

FIG. 12 is a view illustrating the configuration of a conventional I/F converter disclosed in Japanese Patent Application Laid-Open No. 2002-107428. An I/F converter 40 illustrated in this figure includes a current-to-voltage converting circuit 41, a transistor Tr1, a current mirror circuits 42 and 43, a mirror integrator circuit 44, a comparator circuit 45, and a reference voltage source 46.

The current-to-voltage converting circuit 41, which has an operational amplifier 41a and a feedback resistive element Rf, inputs the current value outputted from a current value detecting circuit 4 and then converts it into a voltage value corresponding to the current value to output the voltage value. The transistor Tr1 inputs, at its gate terminal, the voltage value outputted from the current-to-voltage converting circuit 41, allowing the current of the value obtained by logarithmically amplifying the voltage value to flow between the source terminal and the drain terminal. The current mirror circuit 42, which has transistors Tr2 and Tr3, amplifies the current outputted from the transistor Tr1 for output. The current mirror circuit 43, which has transistors Tr4 and Tr5, amplifies the current outputted from the current mirror circuit 42 for output.

The mirror integrator circuit 44, which has an operational amplifier 44a and a feedback capacitive element C, inputs a current outputted from the current mirror circuit 43 to accumulate charges in the capacitive element C corresponding to the input current, and then outputs a voltage value corresponding to the amount of charges accumulated. The comparator circuit 45 compares amplitudes between the voltage value outputted from the mirror integrator circuit 44 and the reference voltage value $V_{ref}$ outputted from the reference voltage source 46 to output a comparison signal indicating the result of the comparison. A switch 34 disposed between the input and output terminals of the operational amplifier 44a of the mirror integrator circuit 44 inputs the comparison signal that has been outputted from the comparator circuit 45 and passed through a buffer amplifier 33, thereby being opened or closed in accordance with the comparison signal.

In the I/F converter 40, a current inputted to the mirror integrator circuit 44 gradually increases the amount of charges accumulated in the capacitive element C, thereby causing the value of the voltage outputted from the mirror integrator circuit 44 to increase. Then after the value of the voltage outputted from the mirror integrator circuit 44 exceeds the reference voltage value $V_{ref}$, the comparison signal outputted from the comparator circuit 45 is inverted, thereby causing the switch 34 to be closed and the capacitive element C to be discharged. When the capacitive element C is discharged, the comparison signal is inverted again and the switch 34 is opened, thus starting building up charges in the capacitive element C. In this manner, charge and discharge operations repeatedly performed on the capacitive element C will cause the comparison signal outputted from the comparator circuit 45 to be turned into a signal that is representative of the repetition of the charge and discharge operations and at a frequency corresponding to the magnitude of the value of the input current.

The I/F converter 40 includes the transistor Tr1 that has a logarithmic amplification characteristic. This is intended to improve the input and output related linearity between the input current value and the output frequency even when use of a transistor having no logarithmic amplification characteristic would cause such a high output frequency (a large input current value) that cannot ensure a sufficient period of time for discharging the capacitive element C. In other words, the I/F converter 40 is intended to improve the input and output related linearity of the input current value over a wide dynamic range.

DISCLOSURE OF THE INVENTION

However, it is difficult for the conventional I/F converter to realize a high input and output related linearity between the input current value and the output frequency with high accuracy over a wide dynamic range. Accordingly, it is also difficult for a photodetector incorporating such an I/F converter and photosensitive element to realize a high input and output related linearity between the intensity of incident light and the output frequency with high accuracy over a wide dynamic range.

The present invention was developed to address the above-mentioned problems. It is therefore an object of the present invention to provide an I/F converter and a photodetector which can realize a high input and output related linearity with high accuracy over a wide dynamic range.

An I/F converter according to the present invention generates a signal at a frequency corresponding to an amplitude of a current inputted to an input end, and the I/F converter comprises (1) switching means for selectively switching to either one of a first output end and a second output end to output the current inputted to the input end, (2) a first capacitive element connected to the first output end of the switching means to accumulate charge corresponding to inputted current, (3) first discharge means for discharging the charge accumulated in the first capacitive element, (4) a first comparator portion connected at its input terminal to one end of the first capacitive element to compare amplitudes between a voltage at the one end of the first capacitive element and a reference voltage, the first comparator portion outputting from its output terminal a first comparison signal indicating a result of the comparison, (5) a second capacitive element connected to the second output end of the switching means to accumulate charge corresponding to inputted current, (6) second discharge means for discharging the charge accumulated in the second capacitive element, and (7) a second comparator portion connected at its input terminal to one end of the second capacitive element to compare amplitudes between a voltage at the one end of the second capacitive element and a reference voltage, the second comparator portion outputting from its output terminal a second comparison signal indicating a result of the comparison.

When this I/F converter is set so that the switching means allows a current to be outputted to the first output end, the current inputted at the input end flows into the first capacitive element via the switching means, causing charges to be built in the first capacitive element. As the amount of charges accumulated in the first capacitive element increases, the voltage applied to the input terminal of the first comparator portion gradually increases and then grows greater than the reference voltage. Then, the first comparison signal outputted from the output terminal of the first comparator portion is inverted in level. The inversion in level of the first comparison signal will cause the charges built in the first capacitive element to be discharged by the first discharge means, thereby allowing the first comparison signal outputted from the output terminal of the first comparator portion to be inverted in level.

Thereafter, the setting is changed such that the switching means outputs the current to the second output end, thereby allowing the current inputted to the input end to flow into the second capacitive element through the switching means to accumulate the charges in the second capacitive element. As the amount of charges accumulated in the second capacitive element increases, the voltage inputted to the input terminal of the second comparator portion gradually increases and then grows greater than the reference voltage. Then, the second comparison signal outputted from the output terminal of the second comparator portion is inverted in level. The inversion in level of the second comparison signal will cause the charges built in the second capacitive element to be discharged by the second discharge means, thereby allowing the second comparison signal outputted from the output terminal of the second comparator portion to be inverted in level.

The operations repeated as described above cause the signals outputted from the first comparator portion or the second comparator portion of the I/F converter to form a pulsed signal, the frequency of which corresponds to the amplitude of the current inputted to the input end.

To perform the above-mentioned operations, the I/F converter may preferably further include timing control means to control the operation of each of the switching means, the first discharge means, and the second discharge means in accordance with the first comparison signal and the second comparison signal.

It is preferable that the I/F converter according to the present invention further includes (1) a third capacitive element connected at one end to the first output end of the switching means as well as to the input terminal of the first comparator portion to accumulate charge corresponding to inputted current, (2) third discharge means for discharging the charge accumulated in the third capacitive element, (3) a fourth capacitive element connected at one end to the second output end of the switching means as well as to the input terminal of the second comparator portion to accumulate charge corresponding to inputted current, (4) fourth discharge means for discharging the charge accumulated in the fourth capacitive element, (5) first connection means for selectively setting to either one of the states with the other end of the first capacitive element connected to a ground potential, with the other end of the first capacitive element connected to the output terminal of the first comparator portion, and with the other end of the first capacitive element opened, (6) second connection means for selectively setting to either one of the states with the other end of the second capacitive element connected to the ground potential, with the other end of the second capacitive element connected to the output terminal of the second comparator portion, and with the other end of the second capacitive element opened, (7) third connection means for selectively setting to either one of the states with the other end of the third capacitive element connected to the ground potential, with the other end of the third capacitive element connected to the output terminal of the first comparator portion, and with the other end of the third capacitive element opened, and (8) fourth connection means for selectively setting to either one of the states with the other end of the fourth capacitive element connected to the ground potential, with the other end of the fourth capacitive element connected to the output terminal of the second comparator portion, and with the other end of the fourth capacitive element opened. It is also preferable that each of the first comparator portion and the second comparator portion is selectively settable to either one of a comparator mode or an amplifier mode. Here, the comparator mode is a mode of operation for comparing amplitudes between the voltage inputted to the input terminal and the reference voltage to output a comparison signal indicating the result of the comparison from the output terminal. On the other hand, the amplifier mode is a mode of operation in which when the feedback capacitive element is connected between the input terminal and the output terminal, the voltage value corresponding to the amount of charges accumulated in the feedback capacitive element is outputted from the output terminal.

As is in this case, the third and fourth capacitive elements, the discharge means for discharging the charges in each capacitive element, and the connection means for setting the connection state of each capacitive element may be further included in addition to the first and second capacitive elements, this arrangement allows for accumulating charges in the first capacitive element, the second capacitive element, the third capacitive element, and the fourth capacitive element repeatedly in that order. This in turn causes the signals outputted from the first comparator portion and the second comparator portion to form a pulsed signal, the frequency of which corresponds to the amplitude of the current inputted to the input end.

In addition, to perform the above-mentioned operations, the I/F converter may preferably further include timing control means, the timing control means provides control in accordance with the first comparison signal and the second comparison signal, and controls an operation of each of the switching means, the first discharge means, the second discharge means, the third discharge means, the fourth discharge means, the first connection means, the second connection means, the third connection means, the fourth connection means, the first comparator portion, and the second comparator portion.

The I/F converter according to the present invention may further preferably include a reference voltage source for supplying the reference voltage to each of the first comparator portion and the second comparator portion, an SR-type flip-flop circuit for inputting the first comparison signal and the second comparison signal, a current mirror circuit for amplifying a current inputted to the input end for output to the switching means, a first overvoltage protection circuit connected to the input terminal of the first comparator portion to reset a potential at the input terminal, and a second overvoltage protection circuit connected to the input terminal of the second comparator portion to reset a potential at the input terminal.

A photodetector according to the present invention includes (1) a photosensitive element for outputting a current of an amplitude corresponding to an intensity of incident light, and (2) an I/F converter according to the present invention described above for inputting a current outputted from the photosensitive element to generate a signal at a frequency corresponding to an amplitude of the current. It is also preferable to further include a counter portion for counting the number of pulses per unit time in the signal generated in the I/F converter.

BEST MODES FOR CARRYING OUT THE INVENTION

Now, the present invention will be explained below in more detail with reference to the accompanying drawings in accordance with the embodiments. Throughout the drawings, the same components are indicated with the same symbols and will not be explained repeatedly.

First Embodiment

Figure 1:
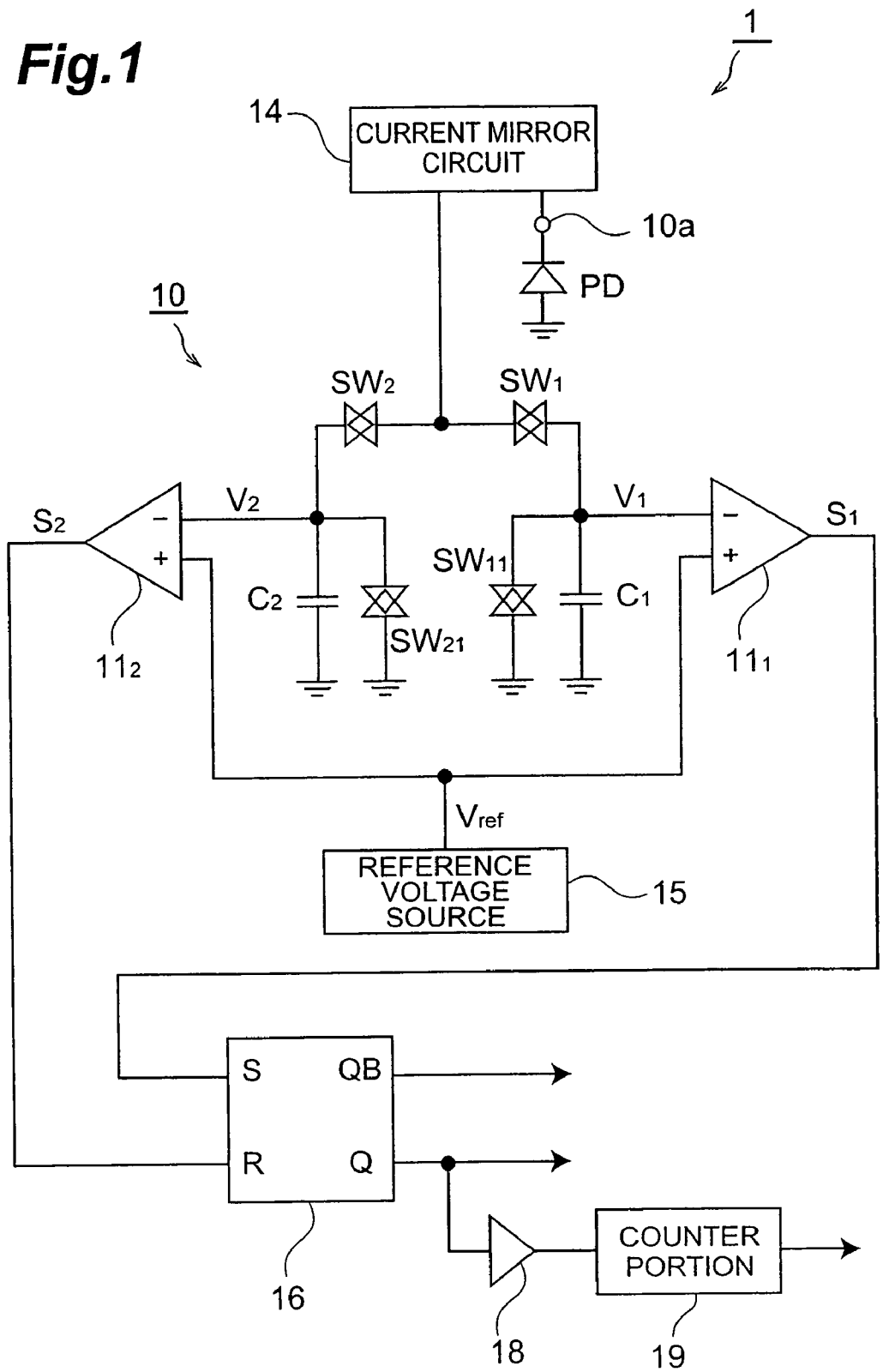
FIG. 1 is a view illustrating the configuration of an I/F converter 10 and a photodetector 1 according to a first embodiment.

First, a description will be made for an I/F converter and a photodetector according to the first embodiment of the present invention. FIG. 1 is a view illustrating the configuration of an I/F converter 10 and a photodetector 1 according to the first embodiment. The photodetector 1 illustrated in this figure includes a photodiode PD for outputting a current of an amplitude corresponding to the intensity of light made incident thereon, the I/F converter 10 for inputting a current outputted from the photodiode PD to generate a signal, and a counter portion 19 for counting the number of pulses per unit time in the signal generated by the I/F converter 10.

The I/F converter 10 includes a first comparator portion $11_1$, a second comparator portion $11_2$, a current mirror circuit 14, a reference voltage source 15, an SR-type flip-flop circuit 16, a buffer amplifier 18, a first capacitive element $C_1$, a second capacitive element $C_2$, a switch $SW_1$, a switch $SW_2$, a switch $SW_{11}$, and a switch $SW_{21}$.

The respective operational characteristics of the first comparator portion $11_1$ and the second comparator portion $11_2$ are identical to each other. The respective capacitance values of the two capacitive elements $C_1$ and $C_2$ are equal to each other. The I/F converter 10 is connected at its input end 10a to the photodiode PD, such that a current generated in the photodiode PD is inputted to the input end 10a, allowing a signal at a frequency corresponding to the amplitude of the inputted current to be outputted from the buffer amplifier 18 to the counter portion 19.

The current mirror circuit 14 amplifies the current inputted at the input end 10a for outputting to the switch $SW_1$ and the switch $SW_2$. The switch $SW_1$ is disposed between the output end of the current mirror circuit 14 and the inverting input terminal of the first comparator portion $11_1$. The switch $SW_2$ is disposed between the output end of the current mirror circuit 14 and the inverting input terminal of the second comparator portion $11_2$. The switch $SW_1$ and the switch $SW_2$ serve as switching means for selectively switching to either one of a first output end (a connection point to the inverting input terminal of the first comparator portion $11_1$) and a second output end (a connection point to the inverting input terminal of the second comparator portion $11_2$) to output the current inputted to the input end 10a and having passed through the current mirror circuit 14.

The first capacitive element $C_1$ is connected at one end to the output end of the current mirror circuit 14 via the switch $SW_1$ as well as to the inverting input terminal of the first comparator portion $11_1$. The other end of the first capacitive element $C_1$ is connected to the ground. The first capacitive element $C_1$ can accumulate charges corresponding to the current inputted. The switch $SW_{11}$ is disposed between the one end of the first capacitive element $C_1$ and the ground potential, serving as first discharge means for discharging the charges accumulated in the first capacitive element $C_1$.

The first comparator portion $11_1$ inputs, at its inverting input terminal, a voltage $V_1$ at the one end of the first capacitive element $C_1$, and also inputs, at its non-inverting input terminal, a reference voltage $V_{ref}$ outputted from the reference voltage source 15, to compare amplitudes between the voltage $V_1$ and the reference voltage $V_{ref}$, and then outputs a first comparison signal $S_1$ indicating the result of the comparison from the output terminal. The first comparison signal $S_1$ is at a high level when the voltage $V_1$ is less than the reference voltage $V_{ref}$, while being at a low level when the voltage $V_1$ is greater than the reference voltage $V_{ref}$.

The second capacitive element $C_2$ is connected at one end to the output end of the current mirror circuit 14 via the switch $SW_2$ as well as to the inverting input terminal of the second comparator portion $11_2$. The other end of the second capacitive element $C_2$ is connected to the ground. The second capacitive element $C_2$ can accumulate charges corresponding to the current inputted. The switch $SW_{21}$ is disposed between the one end of the second capacitive element $C_2$ and the ground potential, serving as second discharge means for discharging the charges accumulated in the second capacitive element $C_2$.

The second comparator portion $11_2$ inputs, at its inverting input terminal, a voltage $V_2$ at the one end of the second capacitive element $C_2$, and also inputs, at its non-inverting input terminal, the reference voltage $V_{ref}$ outputted from the reference voltage source 15, to compare amplitudes between the voltage $V_2$ and the reference voltage $V_{ref}$, and then outputs a second comparison signal $S_2$ indicating the result of the comparison from the output terminal. The second comparison signal $S_2$ is at a high level when the voltage $V_2$ is less than the reference voltage $V_{ref}$, while being at a low level when the voltage $V_2$ is greater than the reference voltage $V_{ref}$.

The reference voltage source 15 generates a constant reference voltage $V_{ref}$, which is supplied to the respective non-inverting input terminals of the first comparator portion $11_1$ and the second comparator portion $11_2$. The SR-type flip-flop circuit 16 inputs, at the S input terminal, the first comparison signal $S_1$ outputted from the first comparator portion $11_1$, and also inputs, at the R input terminal, the second comparison signal $S_2$ outputted from the second comparator portion $11_2$, and then outputs output signals, which change as the respective levels of the first comparison signal $S_1$ and the second comparison signal $S_2$ vary, from the Q output terminal and the QB output terminal, respectively. The buffer amplifier 18 amplifies the signal outputted from the Q output terminal of the SR-type flip-flop circuit 16 for output to the counter portion 19. The counter portion 19 counts the number of pulses per unit time in the signal outputted from the buffer amplifier 18 to output the count as a digital value.

The SR-type flip-flop circuit 16 serves also as timing control means for controlling the operation of each switch in accordance with the first comparison signal $S_1$ and the second comparison signal $S_2$. That is, each of the switch $SW_1$ and the switch $SW_{21}$ is closed when the value of the signal outputted from the QB output terminal of the SR-type flip-flop circuit 16 is at the high level, whereas being opened at the low level. On the other hand, each of the switch $SW_2$ and the switch $SW_{11}$ is closed when the value of the signal outputted from the Q output terminal of the SR-type flip-flop circuit 16 is at the high level, whereas being opened at the low level.

Figure 2:
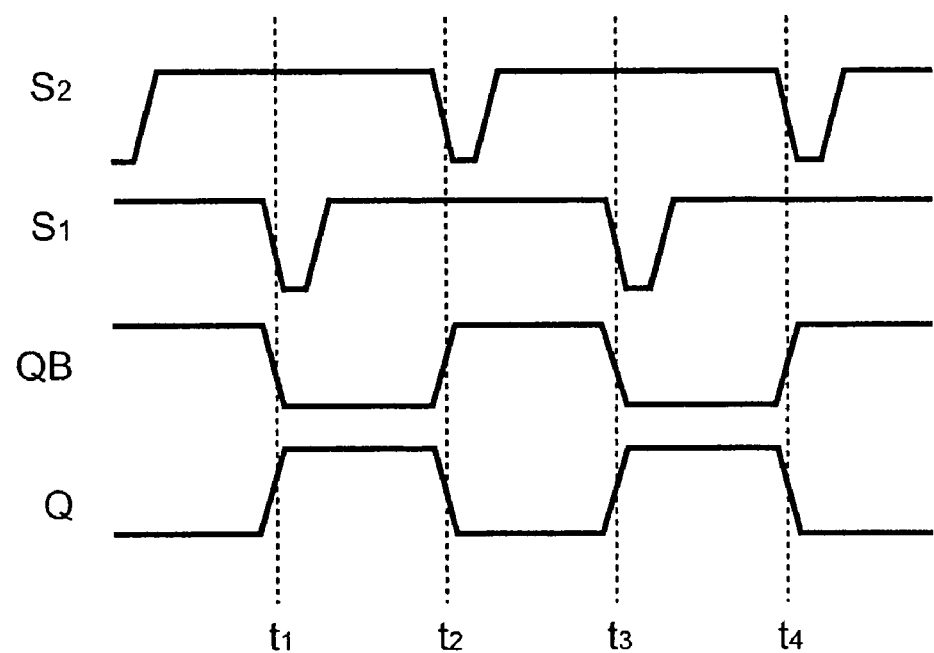
FIG. 2 is an explanatory timing chart illustrating the operation of the I/F converter 10 according to the first embodiment.

A description will now be made for the operation of the I/F converter 10 and the photodetector 1 according to the first embodiment. FIG. 2 is an explanatory timing chart illustrating the operation of the I/F converter 10 according to the first embodiment.

The current outputted from the photodiode PD for which light has been made incident is inputted to the input end $10a$ of the I/F converter 10 and amplified by the current mirror circuit 14, being outputted from the current mirror circuit 14 to the switches $SW_1$ and $SW_2$.

Before time $t_1$, the Q output of the SR-type flip-flop circuit 16 is at the low level with the QB output at the high level, such that each of the switches $SW_1$ and $SW_{21}$ is closed while each of the switches $SW_2$ and $SW_{11}$ is opened. The current outputted from the current mirror circuit 14 flows into the first capacitive element $C_1$ through the switch $SW_1$, allowing the charges to be accumulated in the first capacitive element $C_1$. As the amount of charges accumulated in the first capacitive element $C_1$ increases, the voltage $V_1$ inputted to the inverting input terminal of the first comparator portion $11_1$ gradually increases and then grows greater than the reference voltage $V_{ref}$ applied to the non-inverting input terminal at time $t_1$. At time $t_1$, the first comparison signal $S_1$ outputted from the output terminal of the first comparator portion $11_1$ changes from a high level to a low level.

The first comparison signal $S_1$ thus changes to the low level at time $t_1$, and this will cause the Q output of the SR-type flip-flop circuit 16 to change into the high level and the QB output to change to the low level. This causes each of the switches $SW_1$ and $SW_{21}$ to be opened, and each of the switches $SW_2$ and $SW_{11}$ to be closed. The opening and closing operations of each switch allow the charges accumulated in the first capacitive element $C_1$ to be discharged, and the first comparison signal $S_1$ outputted from the output terminal of the first comparator portion $11_1$ to return to the high level.

After time $t_1$, the current outputted from the current mirror circuit 14 flows into the second capacitive element $C_2$ through the switch $SW_2$, allowing the charges to be built up in the second capacitive element $C_2$. As the amount of charges accumulated in the second capacitive element $C_2$ increases, the voltage $V_2$ inputted to the inverting input terminal of the second comparator portion $11_2$ gradually increases and then grows greater than the reference voltage $V_{ref}$ applied to the non-inverting input terminal at time $t_2$. At time $t_2$, the second comparison signal $S_2$ outputted from the output terminal of the second comparator portion $11_2$ changes from a high level to a low level.

The second comparison signal $S_2$ thus changes to the low level at time $t_2$, and this will cause the Q output of the SR-type flip-flop circuit 16 to change into the low level and the QB output to change to the high level. This causes each of the switches $SW_1$ and $SW_{21}$ to be closed, and each of the switches $SW_2$ and $SW_{11}$ to be opened. The opening and closing operations of each switch allow the charges accumulated in the second capacitive element $C_2$ to be discharged, and the second comparison signal $S_2$ outputted from the output terminal of the second comparator portion $11_2$ to return to the high level.

The operation is repeated in this manner, thereby causing the Q output signal of the SR-type flip-flop circuit 16 to form a pulsed signal, which is inputted to the counter portion 19 via the buffer amplifier 18. Then, the counter portion 19 counts the number of pulses per unit time in the signal outputted from the Q output terminal of the SR-type flip-flop circuit 16, and the value of counts (i.e., the frequency) is outputted as a digital value. The higher the rate of building up charges in each of the first capacitive element $C_1$ and the second capacitive element $C_2$, i.e., the larger the current outputted from the current mirror circuit 14, the higher the frequency obtained in this manner.

Figure 3:
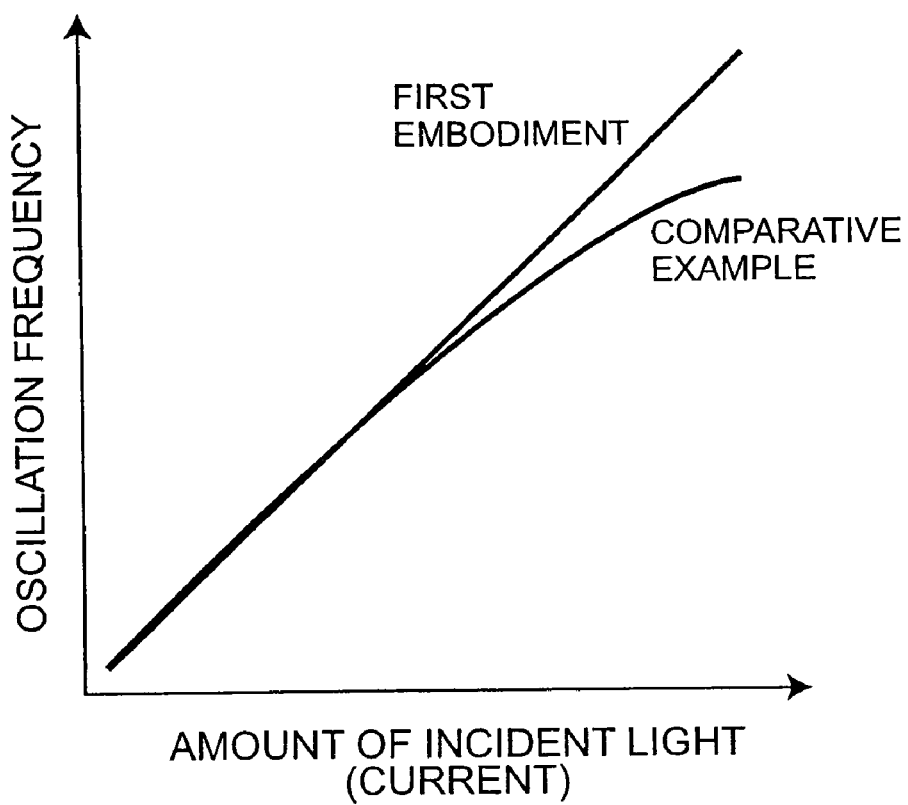
FIG. 3 is a graph showing the operational characteristic of the I/F converter 10 and the photodetector 1 according to the first embodiment.

FIG. 3 is a graph showing the operational characteristic of the I/F converter 10 and the photodetector 1 according to the first embodiment. In this graph, the horizontal axis represents the intensity of light made incident upon the photodiode PD of the photodetector 1 or the value of current inputted to the input end 10*a* of the I/F converter 10. The vertical axis represents the frequency measured by the counter portion 19.

Figure 12:
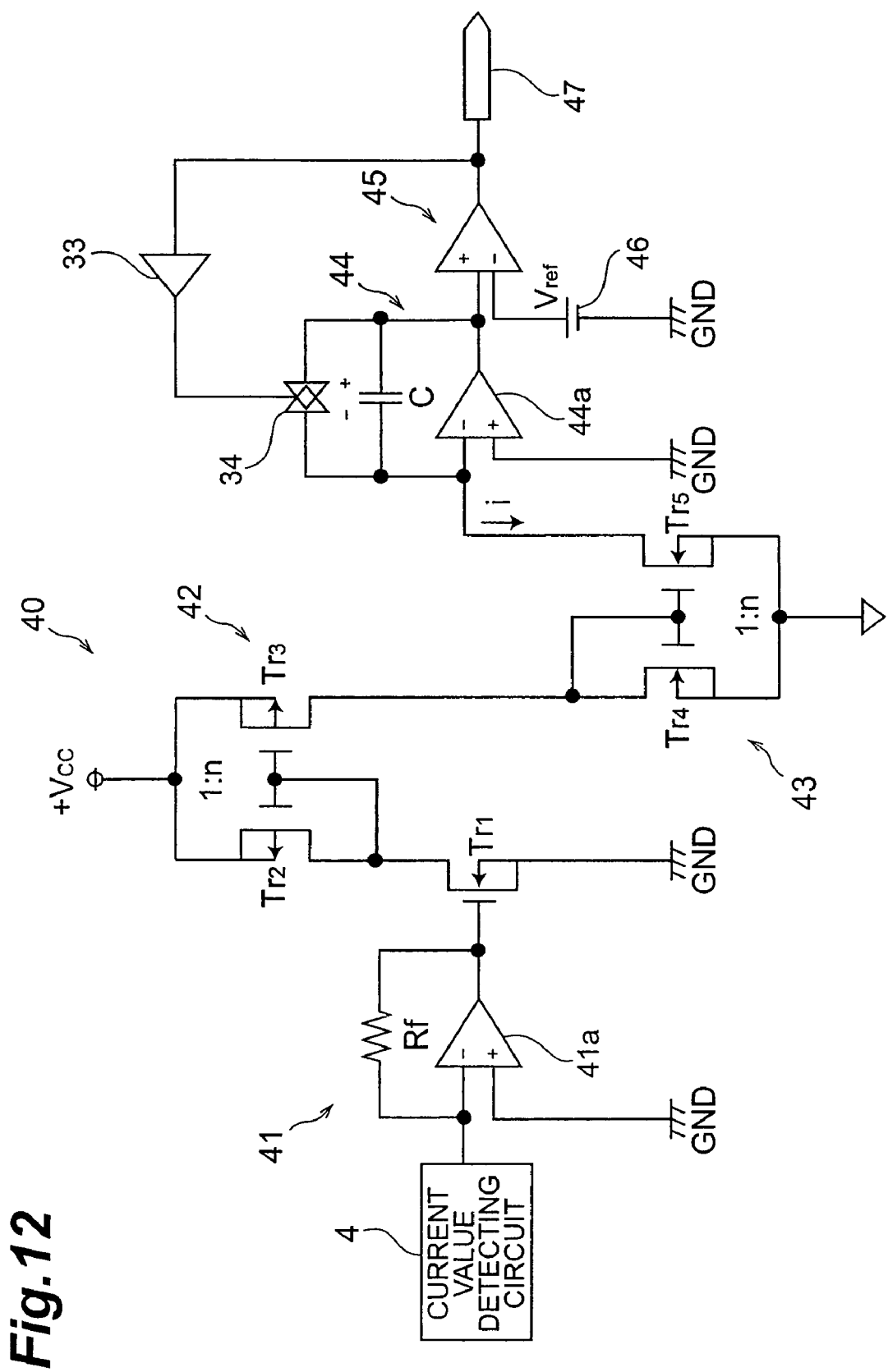
FIG. 12 is a view illustrating the configuration of a conventional I/F converter.

This figure also shows the operational characteristic of the I/F converter configured as shown in FIG. 12, as a comparative example, for comparison to that of the first embodiment. As illustrated in this figure, the comparative example shows that the input/output related linearity is degraded in a region where a larger amount of light is made incident upon the photodiode PD (i.e., in a region with a larger current value). In contrast to this, this embodiment exhibits a good input/output related linearity even in the region where a larger amount of light is made incident upon the photodiode PD (i.e., in a region with a larger current value). As such, the I/F converter 10 and the photodetector 1 according to this embodiment can realize a high input/output related linearity with high accuracy over a wide dynamic range.

Second Embodiment

Figure 4:
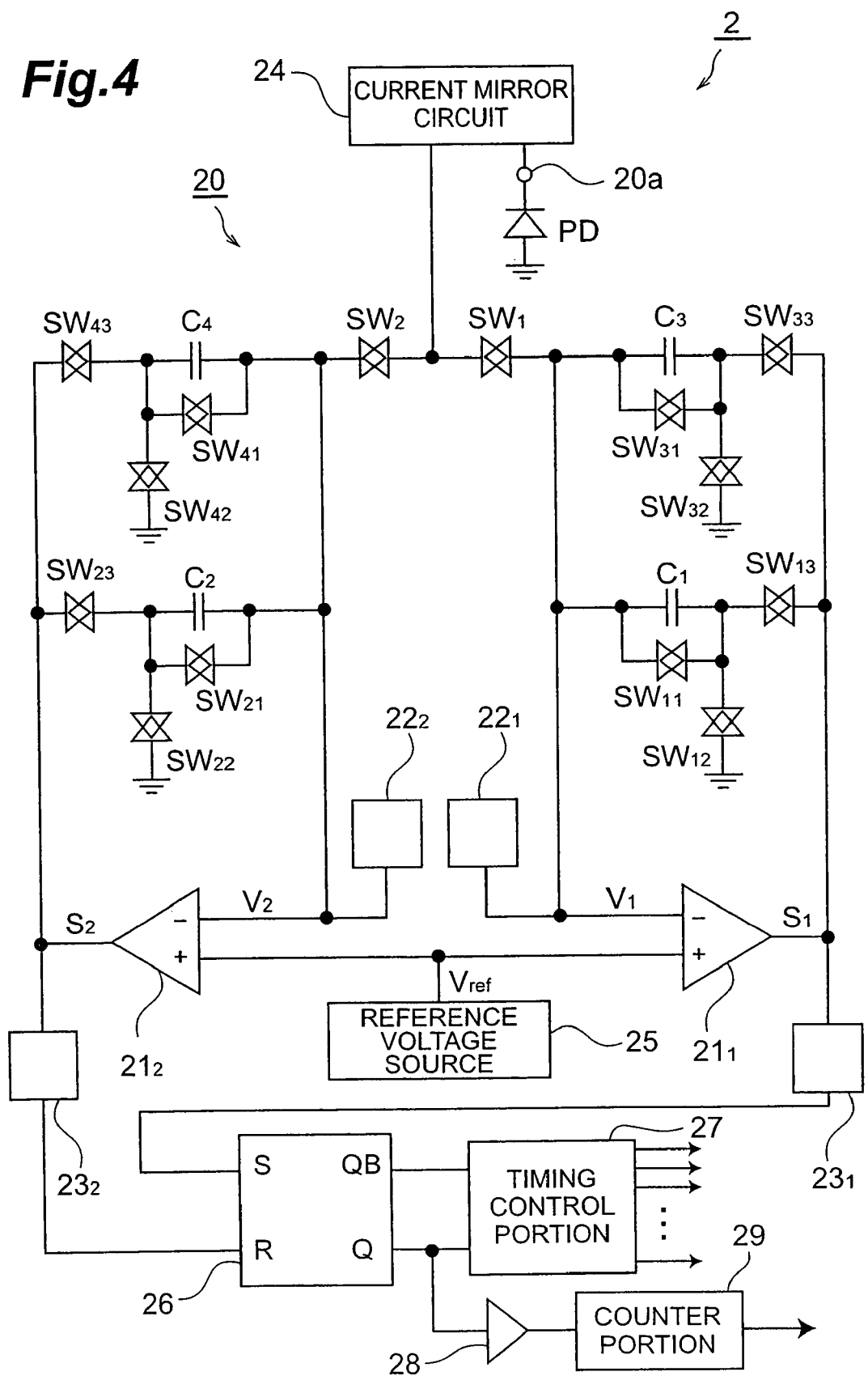
FIG. 4 is a view illustrating the configuration of an I/F converter 20 and a photodetector 2 according to a second embodiment.

Now, a description will be made for an I/F converter and a photodetector according to a second embodiment of the present invention. FIG. 4 is a view illustrating the configuration of an I/F converter 20 and a photodetector 2 according to the second embodiment. The photodetector 2 illustrated in this figure includes a photodiode PD for outputting a current of an amplitude corresponding to the intensity of light made incident thereon, the I/F converter 20 for inputting a current outputted from the photodiode PD to generate a signal, and a counter portion 29 for counting the number of pulses per unit time in the signal generated by the I/F converter 20.

The I/F converter 20 includes a first comparator portion $21_1$, a second comparator portion $21_2$, a first overvoltage protection circuit $22_1$, a second overvoltage protection circuit $22_2$, a first one-shot circuit $23_1$, a second one-shot circuit $23_2$, a current mirror circuit 24, a reference voltage source 25, an SR-type flip-flop circuit 26, a timing control portion 27, a buffer amplifier 28, a first capacitive element $C_1$, a second capacitive element $C_2$, a third capacitive element $C_3$, a fourth capacitive element $C_4$, a switch $SW_1$, a switch $SW_2$, switches $SW_{11}$ to $SW_{13}$, switches $SW_{21}$ to $SW_{23}$, switches $SW_{31}$ to $SW_{33}$, and switches $SW_{41}$ to $SW_{43}$.

The respective operational characteristics of the first comparator portion $21_1$ and the second comparator portion $21_2$ are identical to each other. The respective capacitance values of the four capacitive elements $C_1$ to $C_4$ are equal to each other. The I/F converter 20 is connected at its input end 20*a* to the photodiode PD, such that a current generated in the photodiode PD is inputted to the input end 20*a*, allowing a signal at a frequency corresponding to the amplitude of the inputted current to be outputted from the buffer amplifier 28 to the counter portion 29.

The current mirror circuit 24 amplifies the current inputted at the input end 20*a* for output to the switch $SW_1$ and the switch $SW_2$. The switch $SW_1$ is disposed between the output end of the current mirror circuit 24 and the inverting input terminal of the first comparator portion $21_1$. The switch $SW_2$ is disposed between the output end of the current mirror circuit 24 and the inverting input terminal of the second comparator portion $21_2$. The switch $SW_1$ and the switch $SW_2$ serve as switching means for selectively switching to either one of a first output end (a connection point to the inverting input terminal of the first comparator portion $21_1$) and a second output end (a connection point to the inverting input terminal of the second comparator portion $21_2$) to output the current inputted to the input end 20*a* and having passed through the current mirror circuit 24.

Each of the first capacitive element $C_1$ and the third capacitive element $C_3$ is connected at one end to the output end of the current mirror circuit 24 via the switch $SW_1$ as well as to the inverting input terminal of the first comparator portion $21_1$. Each of the first capacitive element $C_1$ and the third capacitive element $C_3$ can accumulate charges corresponding to the current inputted.

The switch $SW_{11}$ is disposed between the one end and the other end of the first capacitive element $C_1$, serving as first discharge means for discharging the charges accumulated in the first capacitive element $C_1$. The switch $SW_{12}$ is disposed between the other end of the first capacitive element $C_1$ and the ground potential. The switch $SW_{13}$ is disposed between the other end of the first capacitive element $C_1$ and the output terminal of the first comparator portion $21_1$. The switches $SW_{12}$ and $SW_{13}$ serve as first connection means for selectively setting to either one of the states with the other end of the first capacitive element $C_1$ connected to the ground potential, with the other end of the first capacitive element $C_1$ connected to the output terminal of the first comparator portion $21_1$, and with the other end of the first capacitive element $C_1$ opened.

The switch $SW_{31}$ is disposed between the one end and the other end of the third capacitive element $C_3$, serving as third discharge means for discharging the charges accumulated in the third capacitive element $C_3$. The switch $SW_{32}$ is disposed between the other end of the third capacitive element $C_3$ and the ground potential. The switch $SW_{33}$ is disposed between the other end of the third capacitive element $C_3$ and the output terminal of the first comparator portion $21_1$. The switches $SW_{32}$ and $SW_{33}$ serve as third connection means for selectively setting to either one of the states with the other end of the third capacitive element $C_3$ connected to the ground potential, with the other end of the third capacitive element $C_3$ connected to the output terminal of the first comparator portion $21_1$, and with the other end of the third capacitive element $C_3$ opened.

The first comparator portion $21_1$ inputs, at its inverting input terminal, a voltage $V_1$ at the one end of each of the first capacitive element $C_1$ and the third capacitive element $C_3$, and also inputs, at its non-inverting input terminal, a reference voltage $V_{ref}$ outputted from the reference voltage source 25, to compare amplitudes between the voltage $V_1$ and the reference voltage $V_{ref}$, and then outputs a first comparison signal $S_1$ indicating the result of the comparison from the output terminal. The first comparison signal $S_1$ is at the high level when the voltage $V_1$ is less than the reference voltage $V_{ref}$, while being at the low level when the voltage $V_1$ is greater than the reference voltage $V_{ref}$.

Each of the second capacitive element $C_2$ and the fourth capacitive element $C_4$ is connected at one end to the output end of the current mirror circuit 24 via the switch $SW_2$ as well as to the inverting input terminal of the second comparator portion $21_2$. Each of the second capacitive element $C_2$ and the fourth capacitive element $C_4$ can accumulate charges corresponding to the current inputted.

The switch $SW_{21}$ is disposed between the one end and the other end of the second capacitive element $C_2$, serving as second discharge means for discharging the charges accumulated in the second capacitive element $C_2$. The switch $SW_{22}$ is disposed between the other end of the second capacitive element $C_2$ and the ground potential. The switch $SW_{23}$ is disposed between the other end of the second capacitive element $C_2$ and the output terminal of the second comparator portion $21_2$. The switches $SW_{22}$ and $SW_{23}$ serve as second connection means for selectively setting to either one of the states with the other end of the second capacitive element $C_2$ connected to the ground potential, with the other end of the second capacitive element $C_2$ connected to the output terminal of the second comparator portion $21_2$, and with the other end of the second capacitive element $C_2$ opened.

The switch $SW_{41}$ is disposed between the one end and the other end of the fourth capacitive element $C_4$, serving as fourth discharge means for discharging the charges accumulated in the fourth capacitive element $C_4$. The switch $SW_{42}$ is disposed between the other end of the fourth capacitive element $C_4$ and the ground potential. The switch $SW_{43}$ is disposed between the other end of the fourth capacitive element $C_4$ and the output terminal of the second comparator portion $21_2$. The switches $SW_{42}$ and $SW_{43}$ serve as fourth connection means for selectively setting to either one of the states with the other end of the fourth capacitive element $C_4$ connected to the ground potential, with the other end of the fourth capacitive element $C_4$ connected to the output terminal of the second comparator portion $21_2$, and with the other end of the fourth capacitive element $C_4$ opened.

The second comparator portion $21_2$ inputs, at its inverting input terminal, a voltage $V_2$ at the one end of each of the second capacitive element $C_2$ and the fourth capacitive element $C_4$, and also inputs, at its non-inverting input terminal, a reference voltage $V_{ref}$ outputted from the reference voltage source $25$, to compare amplitudes between the voltage $V_2$ and the reference voltage $V_{ref}$, and then outputs a second comparison signal $S_2$ indicating the result of the comparison from the output terminal. The second comparison signal $S_2$ is at the high level when the voltage $V_2$ is less than the reference voltage $V_{ref}$, while being at the low level when the voltage $V_2$ is greater than the reference voltage $V_{ref}$.

The first overvoltage protection circuit $22_1$ is connected to the inverting input terminal of the first comparator portion $21_1$ to reset the potential at the inverting input terminal. Likewise, the second overvoltage protection circuit $22_2$ is connected to the inverting input terminal of the second comparator portion $21_2$ to reset the potential at the inverting input terminal. Each of the first comparator portion $21_1$ and the second comparator portion $21_2$ would not properly operate in a steady state with the voltage at the inverting input terminal being higher than that at the non-inverting input terminal. Such a situation likely occurs when the power is actuated. In this context, the first overvoltage protection circuit $22_1$ and the second overvoltage protection circuit $22_2$ will reset the potential at the respective inverting input terminals of the first comparator portion $21_1$ and the second comparator portion $21_2$, thereby enabling a proper operation.

The first one-shot circuit $23_1$ is disposed between the output terminal of the first comparator portion $21_1$ and the S input terminal of the SR-type flip-flop circuit $26$ so as to stabilize changes in level of the first comparison signal $S_1$ outputted from the first comparator portion $21_1$. The second one-shot circuit $23_2$ is disposed between the output terminal of the second comparator portion $21_2$ and the R input terminal of the SR-type flip-flop circuit $26$ so as to stabilize changes in level of the second comparison signal $S_2$ outputted from the second comparator portion $21_2$. Each of the first one-shot circuit $23_1$ and the second one-shot circuit $23_2$ stabilizes the operation of the SR-type flip-flop circuit $26$.

The reference voltage source $25$ generates a constant reference voltage $V_{ref}$, which is inputted to the respective non-inverting input terminals of the first comparator portion $21_1$ and the second comparator portion $21_2$. The SR-type flip-flop circuit $26$ inputs, at the S input terminal, the first comparison signal $S_1$ outputted from the first comparator portion $21_1$ and having passed through the first one-shot circuit $23_1$, and also inputs, at the R input terminal, the second comparison signal $S_2$ outputted from the second comparator portion $21_2$ and having passed through the second one-shot circuit $23_2$, and then outputs output signals, which change as the respective levels of the first comparison signal $S_1$ and the second comparison signal $S_2$ vary, from the Q output terminal and the QB output terminal, respectively. The buffer amplifier $28$ amplifies the signal outputted from the Q output terminal of the SR-type flip-flop circuit $26$ for output to the counter portion $29$. The counter portion $29$ counts the number of pulses per unit time in the signal outputted from the buffer amplifier $28$ to output the count as a digital value.

The SR-type flip-flop circuit $26$ and the timing control portion $27$ serve as timing control means for controlling the operation of each switch in accordance with the first comparison signal $S_1$ and the second comparison signal $S_2$. That is, the timing control portion $27$ generates and outputs a control signal to control the operation of each switch in accordance with the respective output signals from the Q output terminal and the QB output terminal of the SR-type flip-flop circuit $26$. Then, each switch is closed when the value of the control signal outputted and provided from the timing control portion $27$ is at the high level, whereas being opened at the low level.

Figure 5:
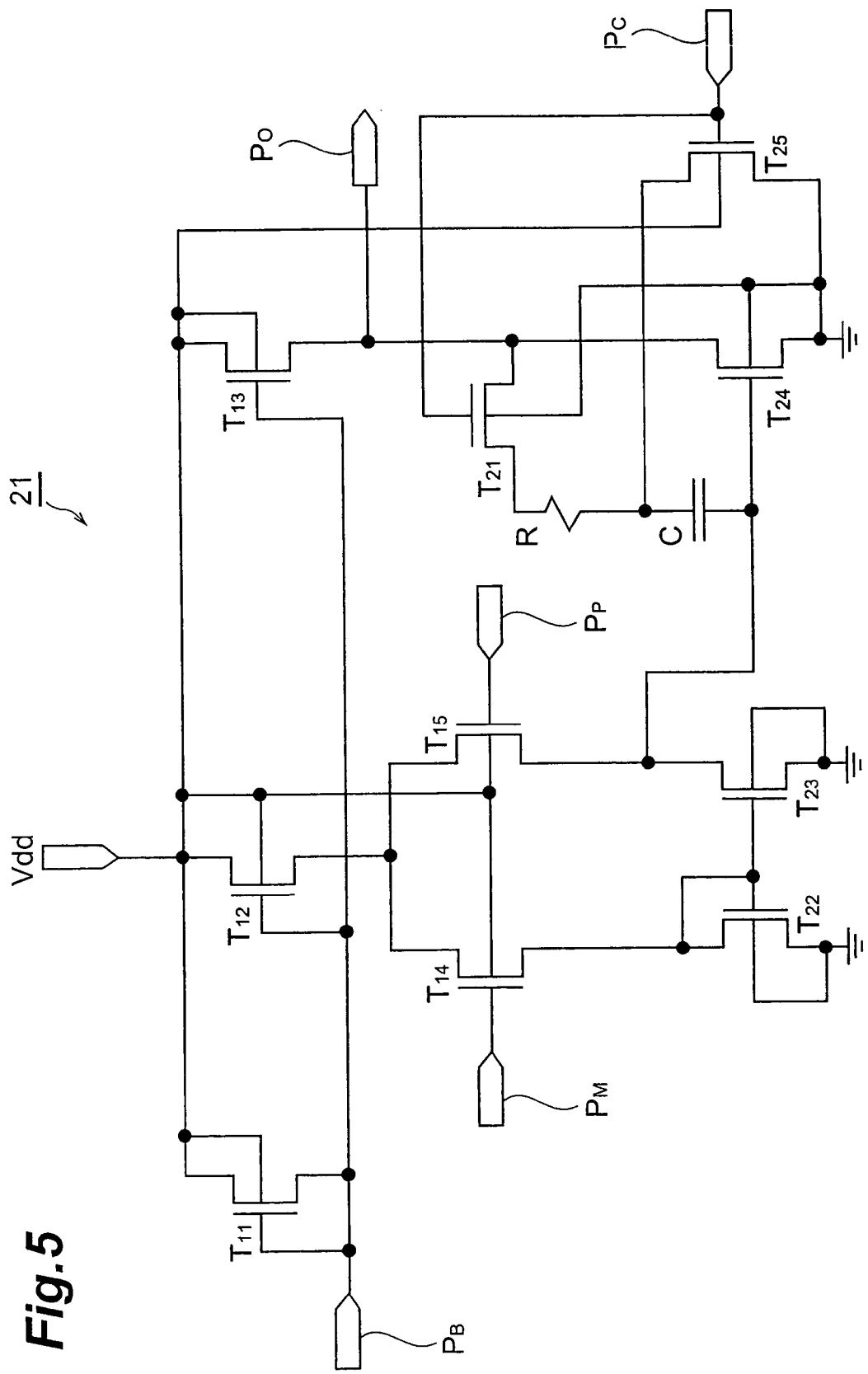
FIG. 5 is a view illustrating an exemplary circuit of each of a first comparator portion $21_1$ and a second comparator portion $21_2$.

FIG. 5 is a view illustrating an exemplary circuit of each of the first comparator portion $21_1$ and the second comparator portion $21_2$. A comparator portion $21$ illustrated in this figure is representative of the first comparator portion $21_1$ and the second comparator portion $21_2$. The comparator portion $21$ includes p-channel CMOS transistors $T_{11}$ to $T_{15}$, n-channel CMOS transistors $T_{21}$ to $T_{25}$, a phase compensation capacitive element $C$, and a resistive element $R$, which are connected as illustrated.

The inverting input terminal $P_M$, which is connected to the gate terminal of the transistor $T_{14}$, inputs the voltage $V_1$ or $V_2$. The non-inverting input terminal $P_P$, which is connected to the gate terminal of the transistor $T_{15}$, inputs the reference voltage $V_{ref}$. The output terminal $P_O$, which is connected to the drain terminal of each of the transistors $T_{13}$, $T_{21}$, and $T_{24}$, outputs the first comparison signal $S_1$ or the second comparison signal $S_2$. The bias input terminal $P_B$, which is connected to the gate terminal of each of the transistors $T_{11}$ to $T_{13}$, sets the bias voltage for operating the comparator portion $21$. The control terminal $P_C$, which is connected to the gate terminal of each of the transistors $T_{21}$ and $T_{25}$, switches between the modes of operation of the comparator portion $21$ (i.e., the comparator mode and the amplifier mode) by connecting or disconnecting the phase compensation capacitive element $C$. The supply terminal $V_{dd}$ is for inputting a supply voltage.

Figure 6:
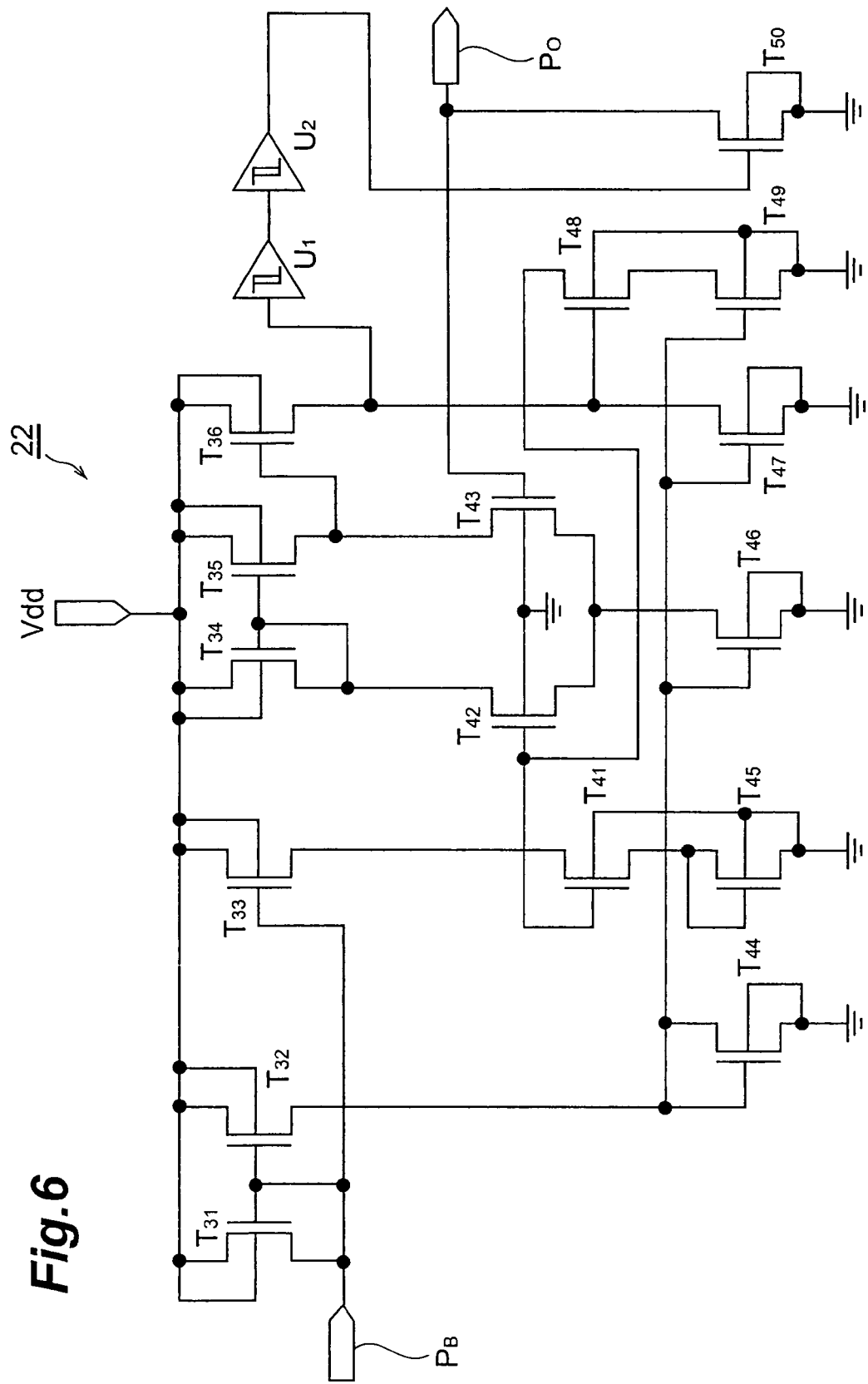
FIG. 6 is a view illustrating an exemplary circuit of each of a first overvoltage protection circuit $22_1$ and a second overvoltage protection circuit $22_2$.

FIG. 6 is a view illustrating an exemplary circuit of each of the first overvoltage protection circuit $22_1$ and the second overvoltage protection circuit $22_2$. An overvoltage protection circuit $22$ illustrated in this figure is representative of the first overvoltage protection circuit $22_1$ and the second overvoltage protection circuit $22_2$. The overvoltage protection circuit $22$ includes p-channel CMOS transistors $T_{31}$ to $T_{36}$, n-channel CMOS transistors $T_{41}$ to $T_{50}$, and Schmitt triggers $U_1$ and $U_2$, which are connected as illustrated.

The bias input terminal $P_B$, which is connected to the gate terminal of each of the transistors $T_{31}$ to $T_{33}$ and the drain terminal of the transistor $T_{31}$, sets the bias voltage for operating the overvoltage protection circuit $22$. The terminal $P_O$, which is connected to the gate terminal of the transistor $T_{43}$ and the drain terminal of the transistor $T_{50}$, is connected to the output terminal of the first comparator portion $21_1$ and the second comparator portion $21_2$.

The bias input terminal $P_B$ biases the circuit. The terminal $P_O$ serves as an input and output terminal. When having reached a preset voltage or no less than the preset voltage, the terminal $P_O$ is instantaneously forced to the ground potential due to the transistor $T_{50}$. When the terminal $P_O$ is at the ground potential (or no greater than the ground potential), the circuit of FIG. 6 is stabilized. The stabilized terminal $P_O$ is in a high-impedance state, having no effects on the circuit to which the terminal $P_O$ is connected. The supply terminal $V_{dd}$ is for inputting a supply voltage.

Figure 7:
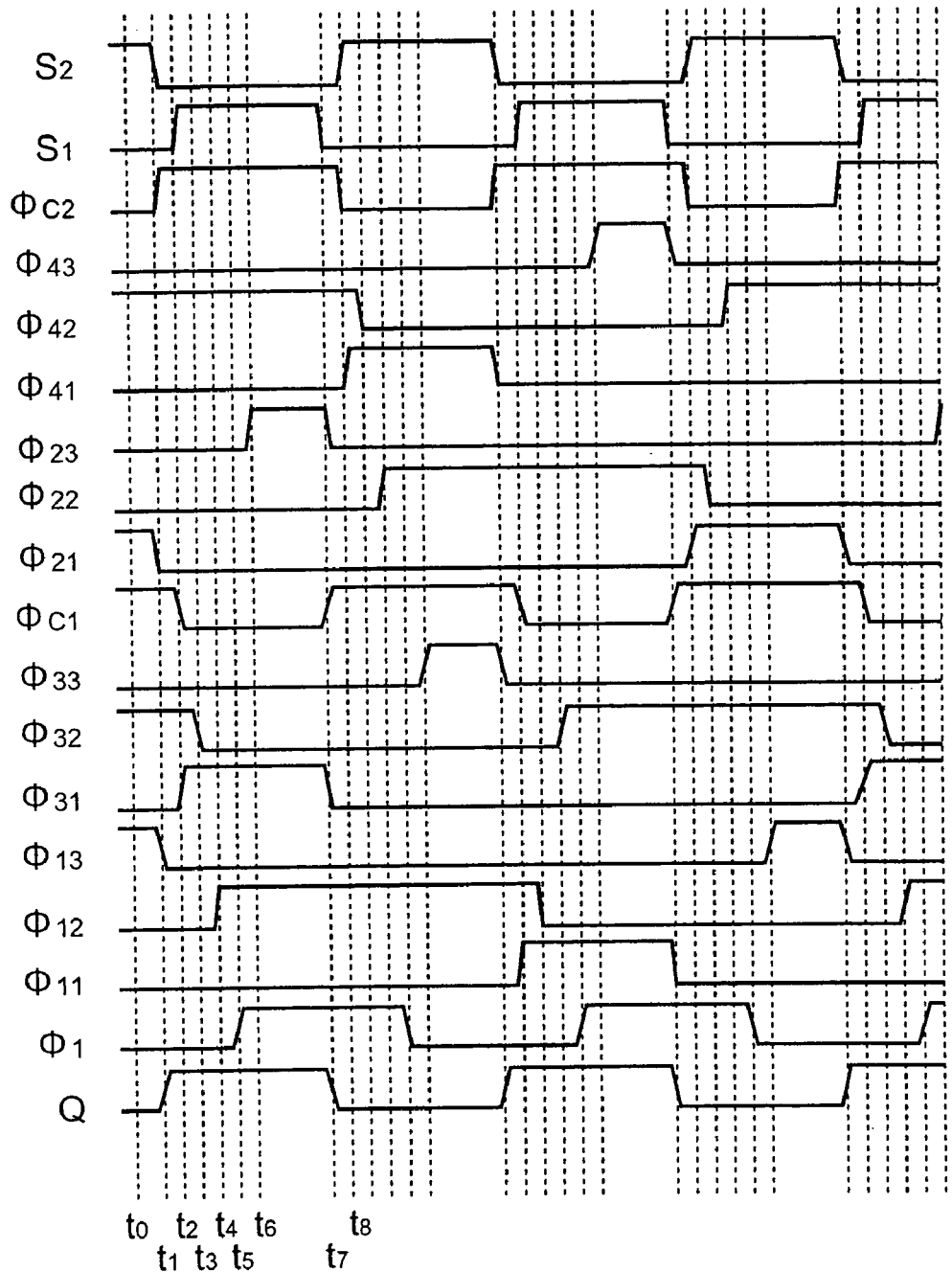
FIG. 7 is an explanatory timing chart illustrating the operation of the I/F converter 20 according to the second embodiment.

A description will now be made to the operation of the I/F converter 20 and the photodetector 2 according to the second embodiment. FIG. 7 is an explanatory timing chart illustrating the operation of the I/F converter 20 according to the second embodiment. In this figure, $\phi_1$ denotes a control signal which controls the opening and closing operation of the switch $SW_1$, $\phi_{ij}$ denotes a control signal which controls the opening and closing operation of the switch $SW_{ij}$ (i=1 to 4, j=1 to 3), $\phi_{C1}$ denotes a control signal which is inputted to the control terminal $P_C$ of the first comparator portion $21_1$ to switch between the modes of operation of the first comparator portion $21_1$, and $\phi_{C2}$ denotes a control signal which is inputted to the control terminal $P_C$ of the second comparator portion $21_2$ to switch between the modes of operation of the second comparator portion $21_2$. Although not illustrated, a control signal $\phi_2$ for controlling the opening and closing operation of the switch $SW_2$ is a level inverted signal of the control signal $\phi_1$.

These control signals $\phi_1$, $\phi_2$, $\phi_{ij}$, $\phi_{C1}$, and $\phi_{C2}$ are outputted from the timing control portion 27. FIGS. 8A to 10C are explanatory views illustrating how each switch is opened or closed at each point in time and how each capacitive element is connected during operation of the I/F converter 20 according to the second embodiment.

The current outputted from the photodiode PD for which light has been made incident is inputted to the input end 20a of the I/F converter 20 and amplified by the current mirror circuit 24, being outputted from the current mirror circuit 24 to the switches $SW_1$ and $SW_2$.

Figure 8A:
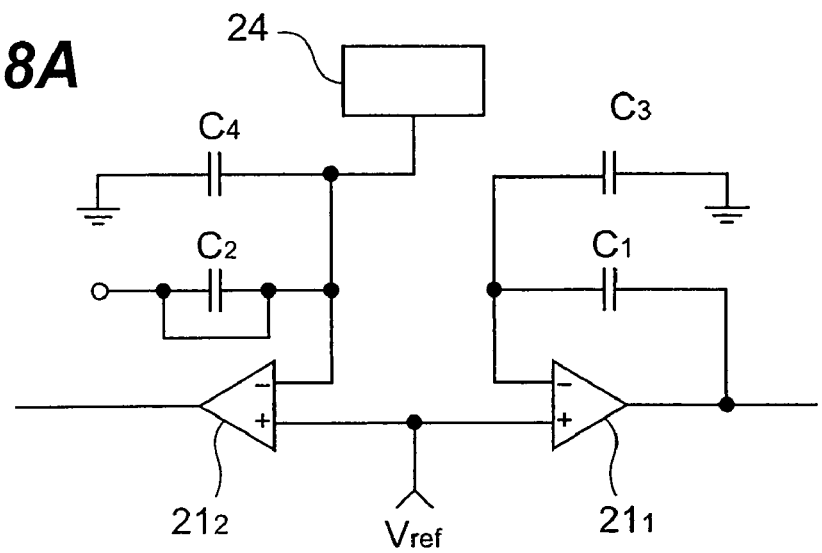
FIGS. 8A to 8C are first explanatory views illustrating how each switch is opened or closed at each point in time and how each capacitive element is connected during operation of the I/F converter 20 according to the second embodiment.

FIG. 8A shows how each switch is opened or closed and how each capacitive element is connected at time $t_0$. At time $t_0$, the Q output of the SR-type flip-flop circuit 26 is at the low level with the QB output at the high level. Additionally, the control signal $\phi_1$ is at the low level, the switch $SW_1$ is opened, the control signal $\phi_2$ is at the high level, and the switch $SW_2$ is closed. As a result, the current outputted from the current mirror circuit 24 will not flow toward the first comparator portion $21_1$ but will flow toward the second comparator portion $21_2$.

At time $t_0$, the control signal $\phi_{11}$ is at the low level, the switch $SW_1$, is opened, the control signal $\phi_{12}$ is at the low level, the switch $SW_{12}$ is opened, the control signal $\phi_{13}$ is at the high level, and the switch $SW_{13}$ is closed. As a result, the first capacitive element $C_1$ is connected as a feedback capacitive element between the inverting input terminal and the output terminal of the first comparator portion $21_1$. The control signal $\phi_{31}$ is at the low level, the switch $SW_{31}$ is opened, the control signal $\phi_{32}$ is at the high level, the switch $SW_{32}$ is closed, the control signal $\phi_{33}$ is at the low level, and the switch $SW_{33}$ is opened. As a result, the third capacitive element $C_3$ is connected between the inverting input terminal of the first comparator portion $21_1$ and the ground potential to be charged at the reference voltage $V_{ref}$. The control signal $\phi_{C1}$ is at the high level and the first comparator portion $21_1$ is in the amplifier mode. The first comparison signal $S_1$ outputted from the output terminal of the first comparator portion $21_1$ is at the low level.

At time $t_0$, the control signal $\phi_{21}$ is at the high level, the switch $SW_2$, is closed, the control signal $\phi_{22}$ is at the low level, the switch $SW_{22}$ is opened, the control signal $\phi_{23}$ is at the low level, and the switch $SW_{23}$ is opened. As a result, the second capacitive element $C_2$ is short-circuited at the ends being disconnected from the output terminal of the second comparator portion $21_2$. The control signal $\phi_{41}$ is at the low level, the switch $SW_{41}$ is opened, the control signal $\phi_{42}$ is at the high level, the switch $SW_{42}$ is closed, the control signal $\phi_{43}$ is at the low level, and the switch $SW_{43}$ is opened. As a result, the fourth capacitive element $C_4$ is connected between the inverting input terminal of the second comparator portion $21_2$ and the ground potential, and accumulates the charges corresponding to the current having flown therein. Here, the voltage at the inverting input terminal of the second comparator portion $21_2$ is below the reference voltage $V_{ref}$. The control signal $\phi_{C2}$ is at the low level and the second comparator portion $21_2$ is in the comparator mode. The second comparison signal $S_2$ outputted from the output terminal of the second comparator portion $21_2$ is at the high level.

After time $t_0$, the current outputted from the current mirror circuit 24 and then flowing toward the second comparator portion $21_2$ side causes the amount of charges accumulated in the fourth capacitive element $C_4$ to gradually increase, thereby allowing the voltage at the inverting input terminal of the second comparator portion $21_2$ to gradually increase as well. Then, at time $t_1$, the voltage at the inverting input terminal of the second comparator portion $21_2$ reaches the reference voltage $V_{ref}$, and the second comparison signal $S_2$ outputted from the output terminal of the second comparator portion $21_2$ changes to the low level, the Q output of the SR-type flip-flop circuit 26 to the high level, and the QB output to the low level.

Figure 8B:
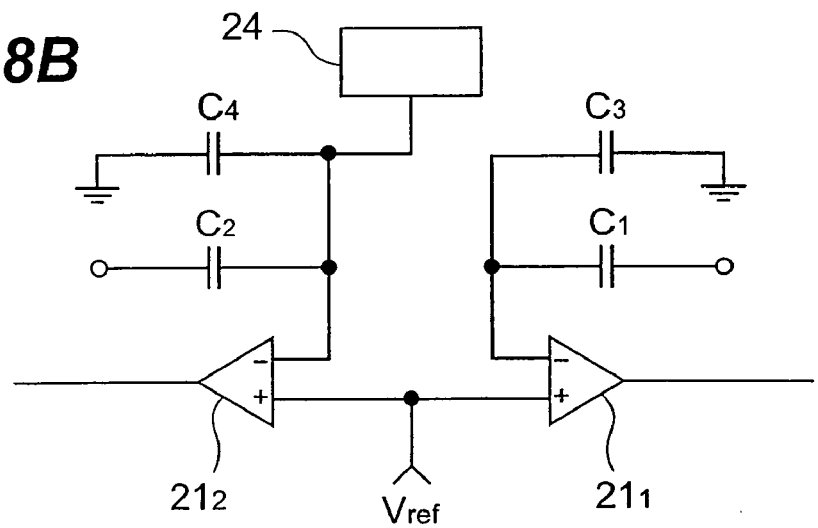

FIG. 8B shows how each switch is opened or closed and how each capacitive element is connected after time $t_1$. At time $t_1$, the control signal $\phi_{13}$ changes into the low level and the switch $SW_{13}$ is opened, and subsequently, the first capacitive element $C_1$ retains the charges that have been accumulated. The control signal $\phi_{21}$ changes into the low level and the switch $SW_{21}$ is opened, and subsequently, the second capacitive element $C_2$ is released from the state with the ends short-circuited. The control signal $\phi_{C2}$ changes into the high level and the second comparator portion $21_2$ is turned into the amplifier mode.

Figure 8C:
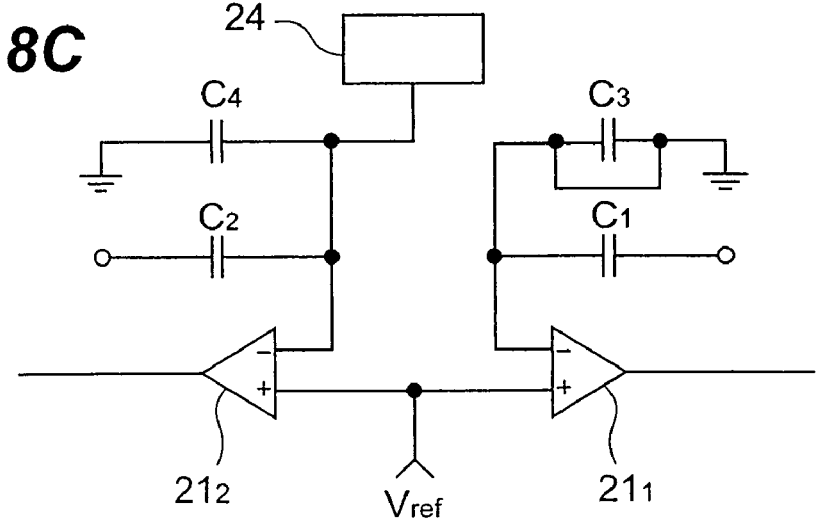

FIG. 8C shows how each switch is opened or closed and how each capacitive element is connected after time $t_2$ at which a certain time has elapsed from time $t_1$. At time $t_2$, the control signal $\phi_{31}$ changes into the high level and the switch $SW_{31}$ is closed, and subsequently, the third capacitive element $C_3$ is short-circuited at the ends to be discharged. The control signal $\phi_{C1}$ changes into the low level and the first comparator portion $21_1$ is turned to the comparator mode. The first comparison signal $S_1$ outputted from the output terminal of the first comparator portion $21_1$ changes into the high level.

Figure 9A:
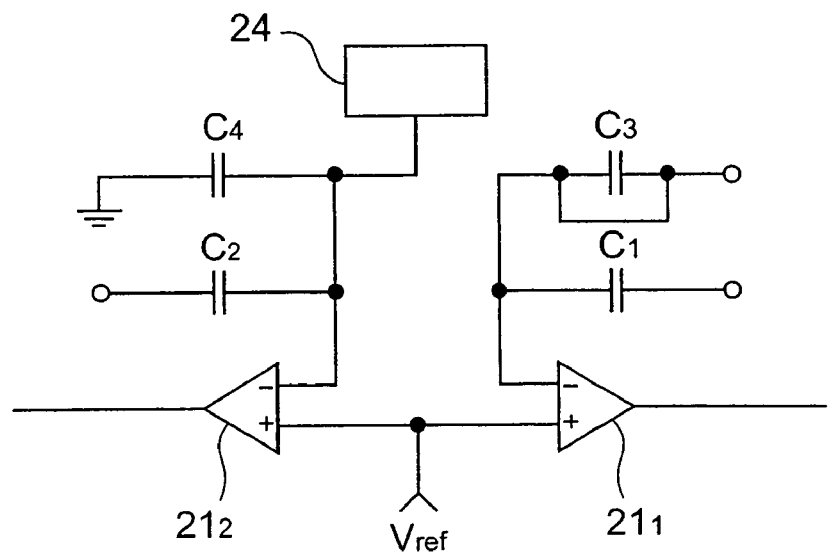
FIGS. 9A to 9C are second explanatory views illustrating how each switch is opened or closed at each point in time and how each capacitive element is connected during operation of the I/F converter 20 according to the second embodiment.

FIG. 9A shows how each switch is opened or closed and how each capacitive element is connected after time $t_3$ at which a certain time has elapsed from time $t_2$. At time $t_3$, the control signal $\phi_{32}$ changes into the low level and the switch $SW_{32}$ is opened, and subsequently, the third capacitive element $C_3$ is disconnected, with the ends thereof remaining short-circuited, from the output terminal of the first comparator portion $21_1$.

Figure 9B:
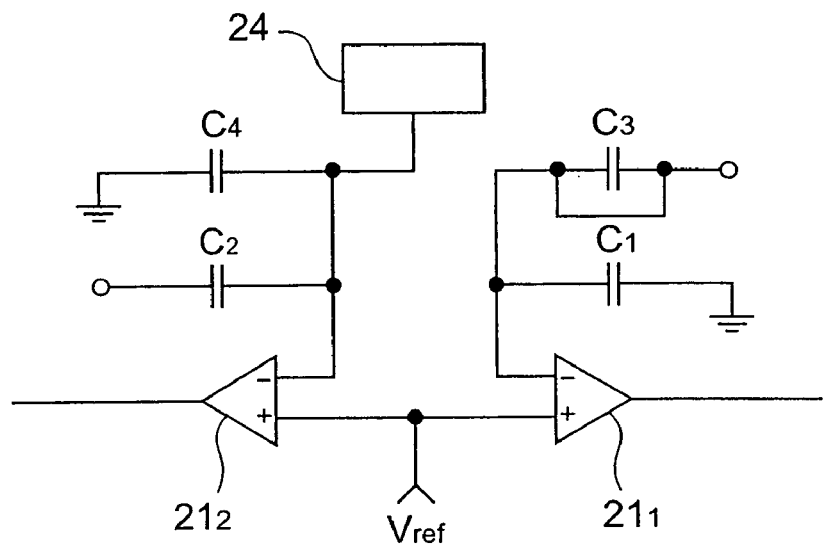

FIG. 9B shows how each switch is opened or closed and how each capacitive element is connected after time $t_4$ at which a certain time has elapsed from time $t_3$. At time $t_4$, the control signal $\phi_{12}$ changes into the high level and the switch $SW_{12}$ is closed, and subsequently, the first capacitive element $C_1$ is connected between the inverting input terminal of the first comparator portion $21_1$ and the ground potential. Additionally, the voltage at the inverting input terminal of the first comparator portion $21_1$ takes a value corresponding to the amount of charges retained in the first capacitive element $C_1$ at time $t_1$.

Figure 9C:
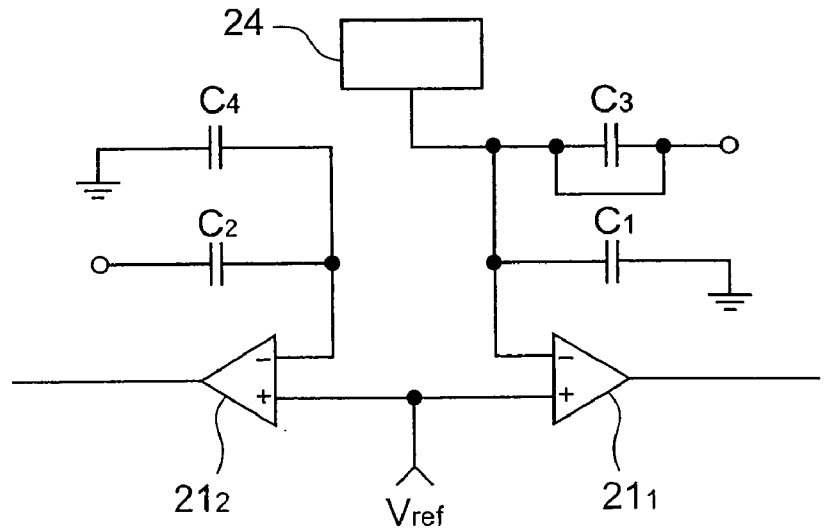

FIG. 9C shows how each switch is opened or closed and how each capacitive element is connected after time $t_5$ at which a certain time has elapsed from time 4. At time $t_5$, the control signal $\phi_1$ changes into the high level and the switch $SW_1$ is closed, and the control signal $\phi_2$ changes into the low level and the switch $SW_2$ is opened, thereby stopping the accumulation of charges in the fourth capacitive element $C_4$ that has been carried out until then. After time $t_5$, the voltage at the inverting input terminal of the second comparator portion $21_2$ is above the reference voltage $V_{ref}$. In addition, after time $t_5$, the current outputted from the current mirror circuit 24 flows into the first comparator portion $21_1$ side, thereby causing the first capacitive element $C_1$ to accumulate the charges therein corresponding to the flowed in current.

Figure 10A:
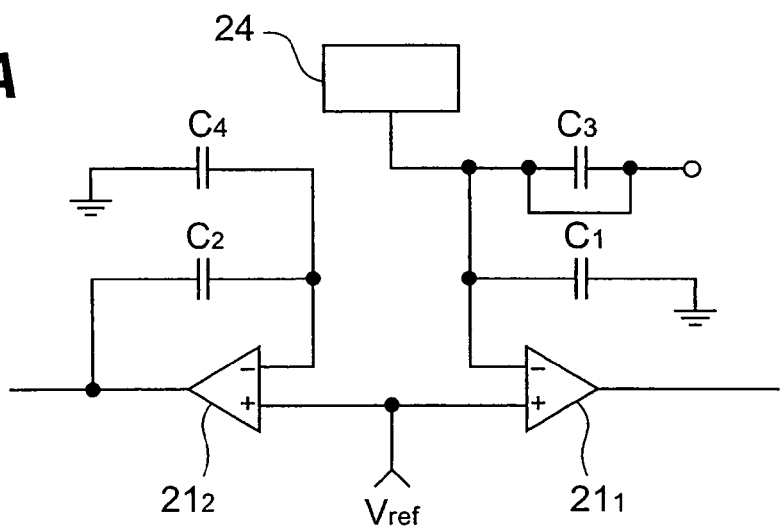
FIGS. 10A to 10C are third explanatory views illustrating how each switch is opened or closed at each point in time and how each capacitive element is connected during operation of the I/F converter 20 according to the second embodiment.

FIG. 10A shows how each switch is opened or closed and how each capacitive element is connected after time $t_6$ at which a certain time has elapsed from time $t_5$. At time $t_6$, the control signal $\phi_{23}$ changes into the high level and the switch $SW_{23}$ is closed, and subsequently, the second capacitive element $C_2$ is connected between the inverting input terminal and the output terminal of the second comparator portion $21_2$. Additionally, after time $t_6$, the voltage at the inverting input terminal of the second comparator portion $21_2$ takes the reference voltage $V_{ref}$. The charge (hereinafter referred to as the excess charge) exceeding the charge corresponding to the reference voltage $V_{ref}$ in the charge which have been accumulated in the fourth capacitive element $C_4$ before time $t_6$ moves to the second capacitive element $C_2$ serving as the feedback capacitive element. The movement of the charge requires time corresponding to the response speed of the second comparator portion $21_2$.

After time $t_6$, the current outputted from the current mirror circuit 24 and then flowing toward the first comparator portion $21_1$ side causes the amount of charges accumulated in the first capacitive element $C_1$ to gradually increase, thereby allowing the voltage at the inverting input terminal of the first comparator portion $21_1$ to gradually increase as well. Then, at time $t_7$, the voltage at the inverting input terminal of the first comparison signal $S_1$ reaches the reference voltage $V_{ref}$, and the first comparison signal $S_1$ outputted from the output terminal of the first comparator portion $21_1$ changes to the low level, the Q output of the SR-type flip-flop circuit 26 to the low level, and the QB output to the high level.

Figure 10B:
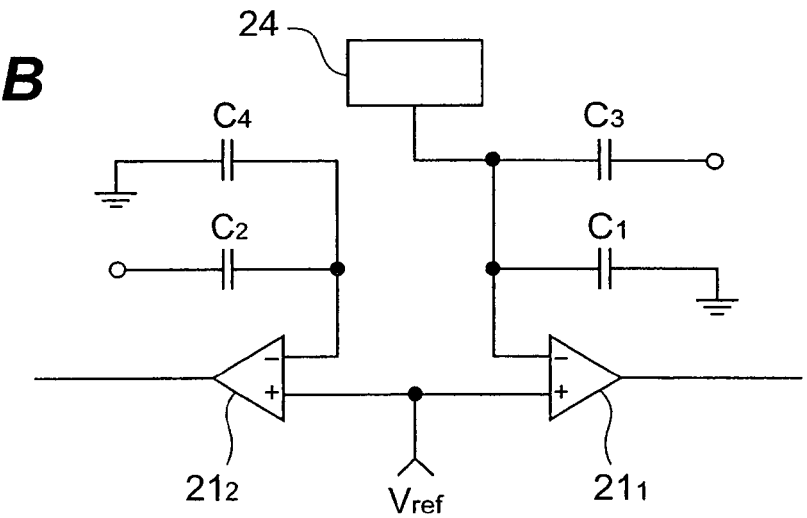

FIG. 10B shows how each switch is opened or closed and how each capacitive element is connected after time $t_7$. At time $t_7$, the control signal $\phi_{31}$ changes into the low level and the switch $SW_{31}$ is opened, and subsequently, the third capacitive element $C_3$ is released from the state with the ends short-circuited. The control signal $\phi_{23}$ changes into the low level and the switch $SW_{23}$ is opened, and subsequently, the second capacitive element $C_2$ retains the charges that have been accumulated. The control signal $\phi_{C1}$ changes into the high level and the first comparator portion $21_1$ is turned into the amplifier mode.

Figure 10C:
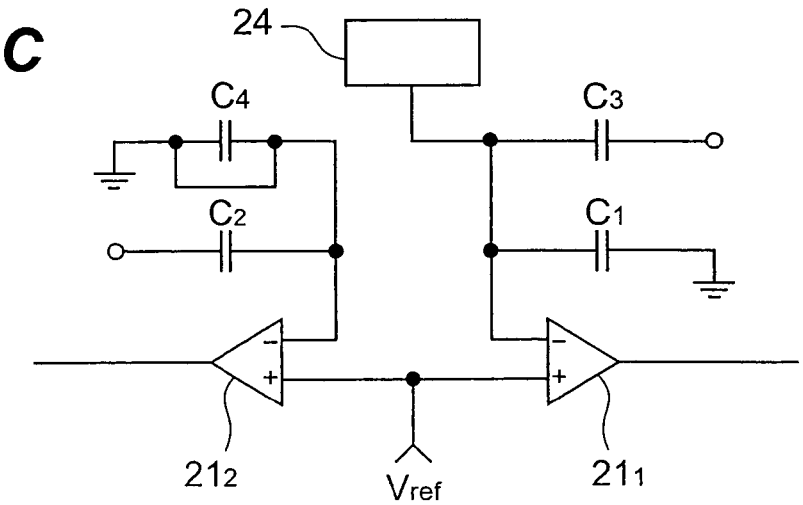

FIG. 10C shows how each switch is opened or closed and how each capacitive element is connected after time $t_8$ at which a certain time has elapsed from time $t_7$. At time $t_8$, the control signal $\phi_{41}$ changes into the high level and the switch $SW_4$, is closed, and subsequently, the fourth capacitive element $C_4$ is short-circuited at the ends to be discharged. The control signal $\phi_{C2}$ changes into the low level and the second comparator portion $21_2$ is turned to the comparator mode. The second comparison signal $S_2$ outputted from the output terminal of the second comparator portion $21_2$ changes into the high level.

Thereafter, the operation is carried out in the same manner. Here, charges are accumulated in the fourth capacitive element $C_4$ from time $t_0$ to time $t_5$. Thereafter, charges are accumulated in the first capacitive element $C_1$, the second capacitive element $C_2$, the third capacitive element $C_3$, and the fourth capacitive element $C_4$ repeatedly in that order. The operations repeated as described above cause the SR-type flip-flop circuit 26 to form a pulsed Q output signal, which is inputted to the counter portion 29 through the buffer amplifier 28. Then, the counter portion 29 counts the number of pulses per unit time in the signal outputted from the Q output terminal of the SR-type flip-flop circuit 26, and the value of counts (i.e., the frequency) is outputted as a digital value. The higher the rate of building up charges in each capacitive element, i.e., the larger the current outputted from the current mirror circuit 24, the higher the frequency obtained in this manner.

For example, when the charge accumulation is switched from the fourth capacitive element $C_4$ to the first capacitive element $C_1$, the excess charge in the charges that have been accumulated in the fourth capacitive element $C_4$ moves to the second capacitive element $C_2$. Then, after the charge accumulation is switched from the first capacitive element $C_1$ to the second capacitive element $C_2$, charges are additionally built up in the second capacitive element $C_2$ in addition to the excess charge that has been accumulated therein. In this manner, when the capacitive elements are switched therebetween to build up charges, the excess charge is not discarded but moved to and built up in the other capacitive element. Accordingly, the I/F converter 20 and the photodetector 2 according to this embodiment can realize a high input/output related linearity with high accuracy over a wide dynamic range.

Figure 11A:
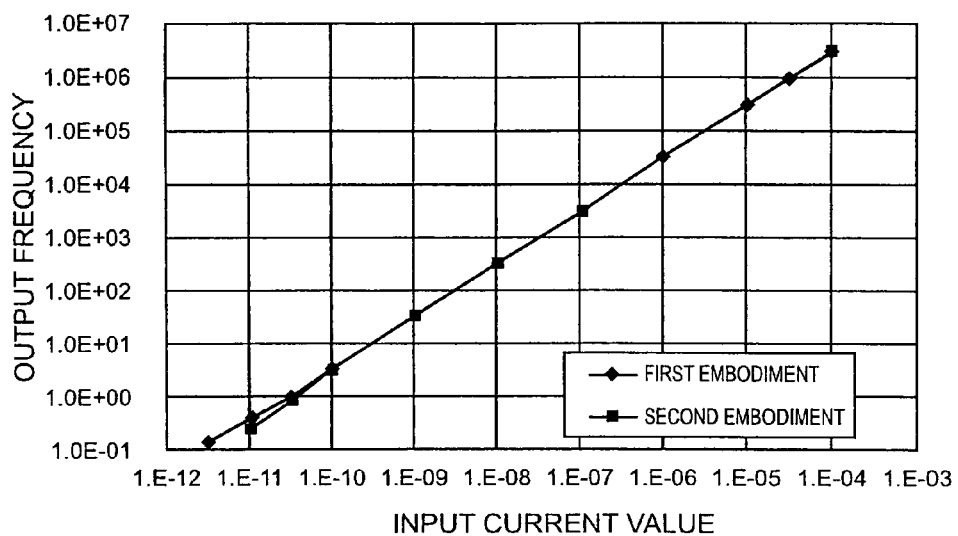
FIGS. 11A and 11B are views illustrating the operational characteristics of the I/F converter 10 of the first embodiment and those of the I/F converter 20 of the second embodiment for comparison purposes.
Figure 11B:
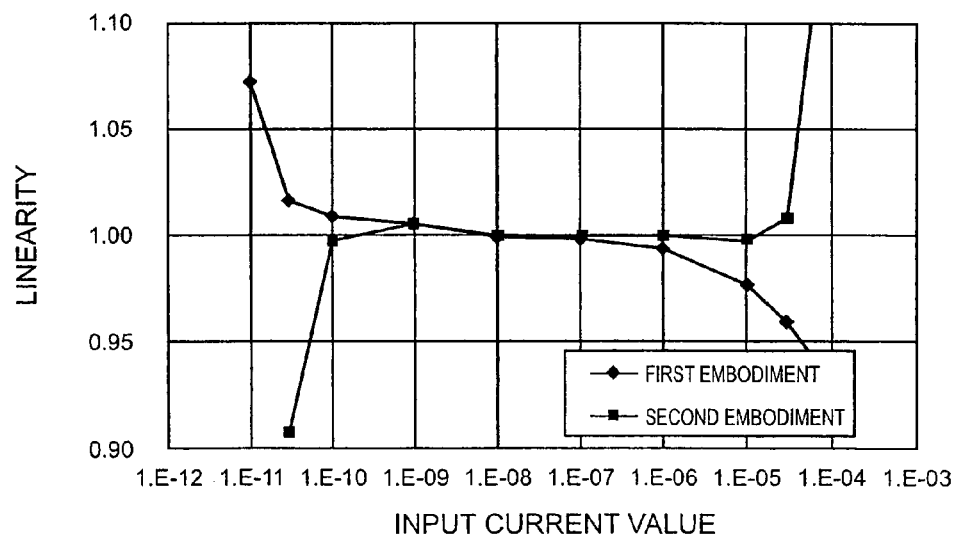

FIGS. 11A and 11B are views illustrating the operational characteristics of the I/F converter 10 of the first embodiment and those of the I/F converter 20 of the second embodiment for comparison purposes. FIG. 11A is a graph showing the relationship between the input current value and the output frequency, FIG. 11B being a graph showing the relationship between the input current value and the linearity. The linearity is indicated with the amount of change in output frequency assumed to one over the range of the input current values from 1 nA to 10 nA. As illustrated in this figure, in either of the first and second embodiments, a high input/output related linearity is realized with high accuracy over a wide dynamic range. When compared with the first embodiment, the second embodiment has realized a high input/output related linearity with high accuracy over a wider dynamic range.

INDUSTRIAL APPLICABILITY

As described above in detail, the I/F converter and the photodetector according to the present invention is available as one which can realize a high input/output related linearity with high accuracy over a wide dynamic range.

The invention claimed is:

1. An I/F converter for generating a signal at a frequency corresponding to an amplitude of a current inputted to an input end, the I/F converter comprising switching means for selectively switching to either one of a first output end and a second output end to output the current inputted to the input end, a first capacitive element connected to the first output end of the switching means to accumulate charge corresponding to inputted current, first discharge means for discharging the charge accumulated in the first capacitive element, a first comparator portion connected at its input terminal to one end of the first capacitive element to compare amplitudes between a voltage at the one end of the first capacitive element and a reference voltage, the first comparator portion outputting from its output terminal a first comparison signal indicating a result of the comparison, a second capacitive element connected to the second output end of the switching means to accumulate charge corresponding to inputted current, second discharge means for discharging the charge accumulated in the second capacitive element, and a second comparator portion connected at its input terminal to one end of the second capacitive element to compare amplitudes between a voltage at the one end of the second capacitive element and a reference voltage, the second comparator portion outputting from its output terminal a second comparison signal indicating a result of the comparison, wherein when the switching means is set so that the switching means allows the current to be outputted to the first output end, the current inputted at the input end flows into the first capacitive element via the switching means, and when the switching means is set so that the switching means allows the current to be outputted to the second output end, the current inputted at the input end flows into the second capacitive element via the switching means.

2. The I/F converter according to claim 1, further comprising timing control means for controlling an operation of each of the switching means, the first discharge means, and the second discharge means in accordance with the first comparison signal and the second comparison signal.

3. The I/F converter according to claim 1, further comprising a reference voltage source for supplying the reference voltage to each of the first comparator portion and the second comparator portion.

4. The I/F converter according to claim 1, further comprising a current mirror circuit for amplifying a current inputted to the input end for output to the switching means.

5. The I/F converter according to claim 1, wherein the switching means includes a first switch disposed between the input end and the first output end, and a second switch disposed between the input end and the second output end.

6. The I/F converter according to claim 1, further comprising output means for inputting the first comparison signal and the second comparison signal, and outputting an output signal, which changes in response to variations in the respective levels of the first comparison signal and the second comparison signal.

7. The I/F converter according to claim 6, wherein the output means is an SR-type flip-flop circuit.

8. An I/F converter for generating a signal at a frequency corresponding to an amplitude of a current inputted to an input end, the I/F converter comprising switching means for selectively switching to either one of a first output end and a second output end to output the current inputted to the input end, a first capacitive element connected to the first output end of the switching means to accumulate charge corresponding to inputted current, first discharge means for discharging the charge accumulated in the first capacitive element, a first comparator portion connected at its input terminal to one end of the first capacitive element to compare amplitudes between a voltage at the one end of the first capacitive element and a reference voltage, the first comparator portion outputting from its output terminal a first comparison signal indicating a result of the comparison, a second capacitive element connected to the second output end of the switching means to accumulate charge corresponding to inputted current, second discharge means for discharging the charge accumulated in the second capacitive element, a second comparator portion connected at its input terminal to one end of the second capacitive element to compare amplitudes between a voltage at the one end of the second capacitive element and a reference voltage, the second comparator portion outputting from its output terminal a second comparison signal indicating a result of the comparison, and an SR-type flip-flop circuit for inputting the first comparison signal and the second comparison signal.

9. A photodetector, comprising a photosensitive element for outputting a current corresponding in amplitude to an intensity of light made incident, and an I/F converter according to claim 1 for inputting a current outputted from the photosensitive element to generate a signal at a frequency corresponding to an amplitude of the current.

10. The photodetector according to claim 9, further comprising a counter portion for counting the number of pulses per unit time in the signal generated in the I/F converter.

* * * * *